United States Patent [19]
Schreck et al.

[11] Patent Number: 5,835,395
[45] Date of Patent: Nov. 10, 1998

[54] EPROM PINOUT OPTION

[75] Inventors: John F. Schreck, Houston; Richard A. Bussey, Missouri City, both of Tex.

[73] Assignee: Texas Instruments Incorporated, Dallas, Tex.

[21] Appl. No.: 82,436

[22] Filed: Jun. 28, 1993

Related U.S. Application Data

[63] Continuation of Ser. No. 651,820, Feb. 7, 1991, abandoned.

[51] Int. Cl.$^6$ .................................................. H01L 21/90
[52] U.S. Cl. ............................... 365/51; 29/574; 29/583; 257/786
[58] Field of Search ............................... 365/51; 29/574, 29/583; 257/786

[56] References Cited

U.S. PATENT DOCUMENTS 4,586,242  5/1986  Harrison .................................. 29/574
5,097,313  3/1992  Fujii ..................................... 365/189.01

Primary Examiner—Eugene R. LaRoche
Assistant Examiner—Viet Q. Nguyen
Attorney, Agent, or Firm—Ronald O. Neerings; Leo N. Heiting; Richard L. Donaldson

[57] ABSTRACT

A memory device is presented having the option, using simple means, of using one basic chip for different pin-outs or chip configurations. The metal and pin-out option implementation are formed by: 1) a dual-function pad and associated circuitry with an option for either an Input/Output or an Input-only configuration and 2) rotation of the chip with respect to the orientation of the DIP (dual in-line package). The implementation of this invention has decreased area requirements and better performance capabilities than those of known prior-art implementations.

12 Claims, 5 Drawing Sheets

ADDRESS INPUT

| PRE-DECODER | | | | | | | |
|---|---|---|---|---|---|---|---|
| PROGRAM PATH | | | | | | | |
| REDUNDANT ROWS | WORDLINE DECODER AND DRIVERS | REDUNDANT COLUMNS | REDUNDANT ROWS | REDUNDANT ROWS | WORDLINE DECODER AND DRIVERS | REDUNDANT ROWS | |
| 512x512 MEMORY CELL ARRAY | | | 512x512 MEMORY CELL ARRAY | 512x512 MEMORY CELL ARRAY | | 512x512 MEMORY CELL ARRAY | |
| COLUMN/ SEGMENT PASS GATES | SEGMENT DECODER | COLUMN/ SEGMENT PASS GATES | COLUMN/ SEGMENT PASS GATES | SEGMENT DECODER | COLUMN/ SEGMENT PASS GATES | | |
| 512x512 MEMORY CELL ARRAY | WORDLINE DECODER AND DRIVERS | REDUNDANT COLUMNS | 512x512 MEMORY CELL ARRAY | 512x512 MEMORY CELL ARRAY | WORDLINE DECODER AND DRIVERS | 512x512 MEMORY CELL ARRAY | |
| 512x512 MEMORY CELL ARRAY | | REDUNDANT COLUMNS | 512x512 MEMORY CELL ARRAY | 512x512 MEMORY CELL ARRAY | | 512x512 MEMORY CELL ARRAY | |
| COLUMN/ SEGMENT PASS GATES | SEGMENT DECODER | COLUMN/ SEGMENT PASS GATES | COLUMN/ SEGMENT PASS GATES | SEGMENT DECODER | COLUMN/ SEGMENT PASS GATES | | |
| 512x512 MEMORY CELL ARRAY | WORDLINE DECODER AND DRIVERS | REDUNDANT COLUMNS | 512x512 MEMORY CELL ARRAY | 512x512 MEMORY CELL ARRAY | WORDLINE DECODER AND DRIVERS | 512x512 MEMORY CELL ARRAY | |
| VIRTUAL GROUND DECODER | COLUMN DECODER | VIRTUAL GROUND DECODER | VIRTUAL GROUND DECODER | COLUMN DECODER | VIRTUAL GROUND DECODER | | |
| SENSE AMPS | | SENSE AMPS | SENSE AMPS | | SENSE AMPS | | |

DATA INPUT/OUTPUT

Fig. 1

| PIN NAMES | |
|---|---|
| $A_0$-$A_{18}$ | ADDRESSES |
| $\overline{CE}$ | CHIP ENABLE |
| $\overline{CE}$ | OUTPUT ENABLE |
| $O_0$-$O_7$ | OUTPUTS |
| NC | NO INTERNAL CONNECT |

| 4MBIT | 2MBIT | 1MBIT | 512K | 256K | 27C040 | | | 256K | 512K | 1MBIT | 2MBIT | 4MBIT |
|---|---|---|---|---|---|---|---|---|---|---|---|---|
| Vpp | Vpp | Vpp | | | Vpp ⊏ 1 | 32 | ⊐ Vcc | | | Vcc | Vcc | Vcc |
| $A_{16}$ | $A_{16}$ | $A_{16}$ | | | $A_{16}$ ⊏ 2 | 31 | ⊐ $A_{18}$ | | | $\overline{PGM}$ | $\overline{PGM}$ | $A_{18}$ |
| $A_{15}$ | $A_{15}$ | $A_{15}$ | $A_{15}$ | Vpp | $A_{15}$ ⊏ 3 | 30 | ⊐ $A_{17}$ | Vcc | Vcc | NC | $A_{17}$ | $A_{17}$ |
| $A_{12}$ | $A_{12}$ | $A_{12}$ | $A_{12}$ | $A_{12}$ | $A_{12}$ ⊏ 4 | 29 | ⊐ $A_{14}$ | $A_{14}$ | $A_{14}$ | $A_{14}$ | $A_{14}$ | $A_{14}$ |
| $A_7$ | $A_7$ | $A_7$ | $A_7$ | $A_7$ | $A_7$ ⊏ 5 | 28 | ⊐ $A_{13}$ | $A_{13}$ | $A_{13}$ | $A_{13}$ | $A_{13}$ | $A_{13}$ |
| $A_6$ | $A_6$ | $A_6$ | $A_6$ | $A_6$ | $A_6$ ⊏ 6 | 27 | ⊐ $A_8$ | $A_8$ | $A_8$ | $A_8$ | $A_8$ | $A_8$ |
| $A_5$ | $A_5$ | $A_5$ | $A_5$ | $A_5$ | $A_5$ ⊏ 7 | 26 | ⊐ $A_9$ | $A_9$ | $A_9$ | $A_9$ | $A_9$ | $A_9$ |
| $A_4$ | $A_4$ | $A_4$ | $A_4$ | $A_4$ | $A_4$ ⊏ 8 | 25 | ⊐ $A_{11}$ | $A_{11}$ | $A_{11}$ | $A_{11}$ | $A_{11}$ | $A_{11}$ |
| $A_3$ | $A_3$ | $A_3$ | $A_3$ | $A_3$ | $A_3$ ⊏ 9 | 24 | ⊐ $\overline{OE}$ | $\overline{OE}$ | $\overline{OE}$/Vpp | $\overline{OE}$ | $\overline{OE}$ | $\overline{OE}$ |
| $A_2$ | $A_2$ | $A_2$ | $A_2$ | $A_2$ | $A_2$ ⊏ 10 | 23 | ⊐ $A_{10}$ | $A_{10}$ | $A_{10}$ | $A_{10}$ | $A_{10}$ | $A_{10}$ |
| $A_1$ | $A_1$ | $A_1$ | $A_1$ | $A_1$ | $A_1$ ⊏ 11 | 22 | ⊐ $\overline{CE}$ | $\overline{CE}$ | $\overline{CE}$ | $\overline{CE}$ | $\overline{CE}$ | $\overline{CE}$ |
| $A_0$ | $A_0$ | $A_0$ | $A_0$ | $A_0$ | $A_0$ ⊏ 12 | 21 | ⊐ $A_7$ | $O_7$ | $O_7$ | $O_7$ | $O_7$ | $O_7$ |
| $Q_0$ | $Q_0$ | $Q_0$ | $Q_0$ | $Q_0$ | $Q_0$ ⊏ 13 | 20 | ⊐ $A_6$ | $O_6$ | $O_6$ | $O_6$ | $O_6$ | $O_6$ |
| $Q_1$ | $Q_1$ | $Q_1$ | $Q_1$ | $Q_1$ | $Q_1$ ⊏ 14 | 19 | ⊐ $A_5$ | $O_5$ | $O_5$ | $O_5$ | $O_5$ | $O_5$ |
| $Q_2$ | $Q_2$ | $Q_2$ | $Q_2$ | $Q_2$ | $Q_2$ ⊏ 15 | 18 | ⊐ $A_4$ | $O_4$ | $O_4$ | $O_4$ | $O_4$ | $O_4$ |
| GND | GND | GND | GND | GND | GND ⊏ 16 | 17 | ⊐ $A_3$ | $O_3$ | $O_3$ | $O_3$ | $O_3$ | $O_3$ |

| 4M | 2M | 1M | 27C240 | | | 1M | 2M | 3M |
|---|---|---|---|---|---|---|---|---|
| Vpp | Vpp | Vpp | Vpp ⊏ 1 | 40 | ⊐ Vcc | Vcc | Vcc | Vcc |
| $\overline{CE}$ | $\overline{CE}$ | $\overline{CE}$ | $\overline{CE}$ ⊏ 2 | 39 | ⊐ $A_{17}$ | $\overline{PGM}$ | $\overline{PGM}$ | $A_{17}$ |
| $Q_{15}$ | $Q_{15}$ | $Q_{15}$ | $Q_{15}$ ⊏ 3 | 38 | ⊐ $A_{16}$ | NC | $A_{16}$ | $A_{16}$ |
| $Q_{14}$ | $Q_{14}$ | $Q_{14}$ | $Q_{14}$ ⊏ 4 | 37 | ⊐ $A_{15}$ | $A_{15}$ | $A_{15}$ | $A_{15}$ |
| $Q_{13}$ | $Q_{13}$ | $Q_{13}$ | $Q_{13}$ ⊏ 5 | 36 | ⊐ $A_{14}$ | $A_{14}$ | $A_{14}$ | $A_{14}$ |
| $Q_{12}$ | $Q_{12}$ | $Q_{12}$ | $Q_{12}$ ⊏ 6 | 35 | ⊐ $A_{13}$ | $A_{13}$ | $A_{13}$ | $A_{13}$ |
| $Q_{11}$ | $Q_{11}$ | $Q_{11}$ | $Q_{11}$ ⊏ 7 | 34 | ⊐ $A_{12}$ | $A_{12}$ | $A_{12}$ | $A_{12}$ |
| $Q_{10}$ | $Q_{10}$ | $Q_{10}$ | $Q_{10}$ ⊏ 8 | 33 | ⊐ $A_{11}$ | $A_{11}$ | $A_{11}$ | $A_{11}$ |
| $Q_9$ | $Q_9$ | $Q_9$ | $Q_9$ ⊏ 9 | 32 | ⊐ $A_{10}$ | $A_{10}$ | $A_{10}$ | $A_{10}$ |
| $Q_8$ | $Q_8$ | $Q_8$ | $Q_8$ ⊏ 10 | 31 | ⊐ $A_9$ | $A_9$ | $A_9$ | $A_9$ |
| GND | GND | GND | GND ⊏ 11 | 30 | ⊐ GND | GND | GND | GND |
| $Q_7$ | $Q_7$ | $Q_7$ | $Q_7$ ⊏ 12 | 29 | ⊐ $A_8$ | $A_8$ | $A_8$ | $A_8$ |
| $Q_6$ | $Q_6$ | $Q_6$ | $Q_6$ ⊏ 13 | 28 | ⊐ $A_7$ | $A_7$ | $A_7$ | $A_7$ |
| $Q_5$ | $Q_5$ | $Q_5$ | $Q_5$ ⊏ 14 | 27 | ⊐ $A_6$ | $A_6$ | $A_6$ | $A_6$ |
| $Q_4$ | $Q_4$ | $Q_4$ | $Q_4$ ⊏ 15 | 26 | ⊐ $A_5$ | $A_5$ | $A_5$ | $A_5$ |
| $Q_3$ | $Q_3$ | $Q_3$ | $Q_3$ ⊏ 16 | 25 | ⊐ $A_4$ | $A_4$ | $A_4$ | $A_4$ |
| $Q_2$ | $Q_2$ | $Q_2$ | $Q_2$ ⊏ 17 | 24 | ⊐ $A_3$ | $A_3$ | $A_3$ | $A_3$ |
| $Q_1$ | $Q_1$ | $Q_1$ | $Q_1$ ⊏ 18 | 23 | ⊐ $A_2$ | $A_2$ | $A_2$ | $A_2$ |
| $Q_0$ | $Q_0$ | $Q_0$ | $Q_0$ ⊏ 19 | 22 | ⊐ $A_1$ | $A_1$ | $A_1$ | $A_1$ |
| $\overline{OE}$ | $\overline{OE}$ | $\overline{OE}$ | $\overline{OE}$ ⊏ 20 | 21 | ⊐ $A_0$ | $A_0$ | $A_0$ | $A_0$ |

Fig.2

| X16 | X8 |
|---|---|
| $A_4$ | $A_{13}$ |
| $A_3$ | $A_8$ |
| $A_2$ | $A_9$ |
| $A_1$ | NC |
| $A_0$ | $A_{11}$ |
| $\overline{G}$ | NC |
| $Q_1$ | $\overline{G}$ |
| $Q_2$ | $A_{10}$ |
| $Q_3$ | $\overline{E}$ |
| $Q_4$ | $Q_8$ |
| $Q_5$ | $Q_7$ |
| $Q_6$ | $Q_6$ |
| $Q_7$ | $Q_5$ |
| $Q_8$ | $Q_4$ |
| VSS/GND | VSS/GND |
| NC | VSS/GND |
| $Q_9$ | $Q_3$ |
| $Q_{10}$ | NC |
| $Q_{11}$ | $Q_2$ |
| $Q_{12}$ | NC |
| $Q_{13}$ | $Q_1$ |
| $Q_{14}$ | $A_0$ |
| $Q_{15}$ | $A_1$ |
| $Q_{16}$ | $A_2$ |
| $\overline{E}$ | $A_3$ |
| Vpp | NC |
| Vcc | NC |
| Vcc | NC |
| $A_{17}$ | $A_4$ |
| $A_{16}$ | $A_5$ |
| $A_{15}$ | $A_6$ |
| $A_{14}$ | $A_7$ |
| $A_{13}$ | $A_{12}$ |
| $A_{12}$ | NC |
| $A_{11}$ | $A_{15}$ |
| $A_{10}$ | NC |
| $A_9$ | $A_{16}$ |
| NC | Vpp |
| NC | Vcc |
| VSS/GND | Vcc |
| $A_8$ | NC |
| $A_7$ | $A_{18}$ |
| $A_6$ | $A_{17}$ |
| $A_5$ | $A_1$ |

*Fig. 5*

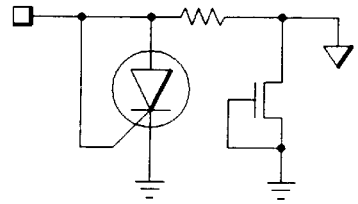

*Fig. 6*

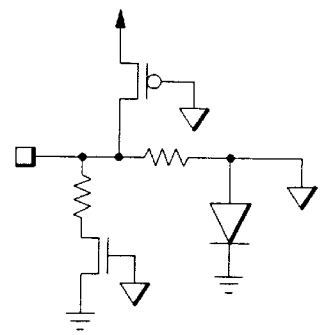

*Fig. 7*

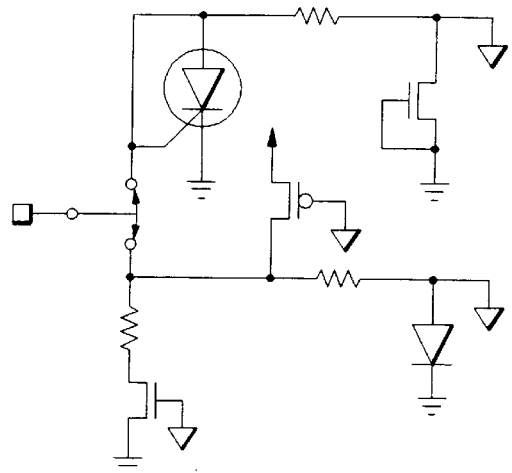

*Fig. 8*

EPROM PINOUT OPTION

This application is a continuation of application Ser. No. 07/651,820, filed Feb. 7, 1991 now abandoned.

FIELD OF THE INVENTION

This invention relates to implementation of a pin-out option for integrated circuits, such as erasable and programmable read-only-memories (EPROMs). In particular, this invention relates to implementation of a x8 and a x16 pin-out option for an EPROM.

BACKGROUND OF THE INVENTION

Memory chips commonly have metal or bonding options to obtain different pin-outs or chip configurations. For example, some Dynamic Random Access Memories (DRAMs) have options that allow x1 or x4 configuration bonding options.

Most EPROM designers organize their chips such that all of the I/O functions reside directly below or above a chip's columns or bit lines. To meet this requirement for a multiple configuration bonding option, most chip designers design two totally different chips. Designers that opt for one chip having multiple configuration bonding options typically route the Vss and data pins a long distance resulting in large bus drops. An alternative method requires routing the interconnect to duplicated bond pads. This interconnect includes the input line when the I/O pin serves as an input and the pre-driver output lines that go to the driver transistors that are active when the pin serves as an output. Chips that alternatively have multiple pinout options either duplicate the total pad structure or the input pin function is accomplished by using the I/O pin structure.

What is needed is one basic chip that has the option, using simple means, to serve as a multiple pin-out configuration EPROM.

SUMMARY OF THE INVENTION

Generally, and in one form of the invention, a metal and pin-out option on a 4 Mb EPROM is accomplished by dual-function pads with associated circuitry and rotation of the chip with respect to the orientation of the DIP (dual in-line package). In both the x8 and x16 embodiments, the I/O pins reside directly beneath the columns and the basic Vss structure remains in tact. The Vss bus structure remains intact because it is located in the same location on the chip for both options. The Vcc bus can be modified for each particular option since it is more important to minimize Vss resistance than Vcc resistance. Rotation of a single chip used for the two embodiments presents performance benefits resulting from less routing, especially of busses, as compared with a non-rotated single chip used for the two embodiments.

A dual function bond pad having a changeable structure offers several benefits. The dual function allows input pins to maintain all of the beneficial input properties for one option and all of the good I/O properties for the second option. The other benefit is that no extra area is required if the single function pins are duplicated. This can happen when the I/O pin of the x8 option is copied for the x16 option.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is an electrical diagram in block form of a semi-conductor memory device of the floating gate 4 Mb EPROM type using features of the invention.

FIG. 2 is a plan view of two pin-out options for the 4 Mb EPROM.

FIG. 5 is a chart comparison of the bond pads of FIGS. 3a and 3b.

FIG. 6 is an electrical schematic diagram of an input only function.

FIG. 7 is an electrical schematic diagram of a common I/O function.

FIG. 8 is an electrical schematic diagram of a dual function pin with the optional connections.

DETAILED DESCRIPTION OF THE PREFERRED EMBODIMENT

Referring to FIG. 1, a memory system using features of the invention is shown. Although the invention may be used in memory devices of various types and sizes, the example shown here is an integrated circuit layout for a nominal four megabit EPROM. The layout, in which dimensional proportions are not those of actual manufacture, illustrates sixteen 512 by 512 memory sub-arrays with redundant rows and columns used to replace rows and columns having defective cells. Peripheral circuitry, including row decoders, column decoders, virtual-ground decoders, wordline drivers, and column/segment pass gates, functions to connect reading and programming voltages to the rows and columns of cells in response to address inputs routed through a pre-decoder and program path. Data are written into the memory arrays during programming operations. During reading operations, data from the memory arrays are routed through sense amplifiers to the output.

In FIG. 2, two pin-out options for the 4 Mb EPROM are shown. DIP (dual in-line package) 10 (Texas Instruments 27C040) incorporates a 4 Mb EPROM having a x8 pin-out option. DIP (dual in-line package) 12 (Texas Instruments 27C240) incorporates a 4 Mb EPROM having a x16 pin-out option. Notice the position of data pins Q1–Q8 for x8 pin-out option DIP 10. Pins Q1–Q8 are located at the bottom of the DIP. Next, compare the position of data pins Q1–Q16 for x16 pin-out option DIP 12. Pins Q1–Q16 are located on the left side of the DIP. Also, notice the location of the Vss pin with respect to the data pin locations. The location is favorable for Vss because large currents flow through the output pins to Vss when the chip is reading low logic levels called "zeros". If the busses connecting Vss to the output drivers are too resistive, meeting the VOL specification is difficult.

Rotation of a chip, having one pin-out option, within the DIP as compared with the chip, having another pin-out option, presents favorable results. The I/O pins continue to reside directly beneath the columns and the basic Vss bus structure remains intact. The Vss bus remains intact because it is located in the same location of the chip for both options. Vcc, however, can be modified using a metal option since it is more important to minimize Vss resistance than Vcc resistance. The rotation of a single chip for both pin-out options, as compared with a non-rotated single chip for both pin-out options, results in performance benefits and less routing, especially of busses.

Figures 3A, 3B:
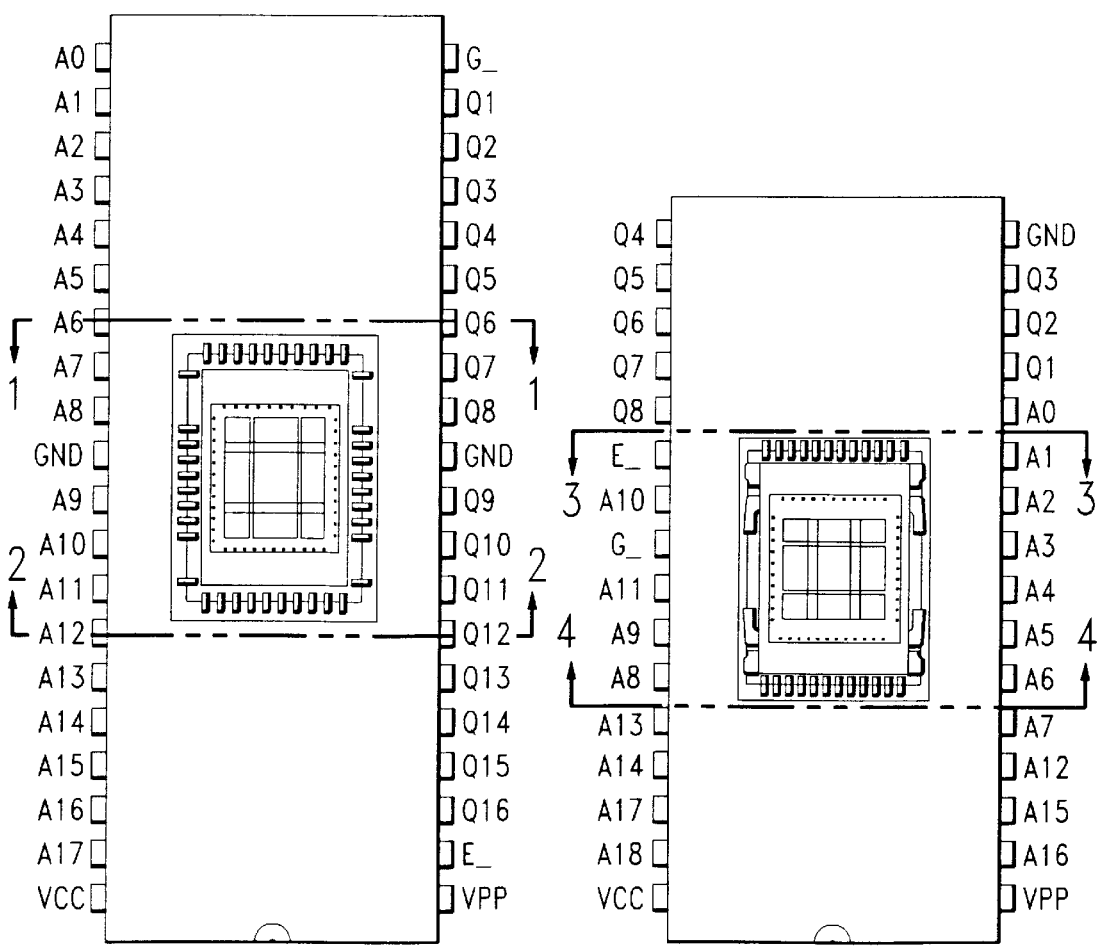
FIGS. 3a and 3b show a plan view of the plot of the metal level for both pinout options with the pins labelled.
Figures 4A, 4B:
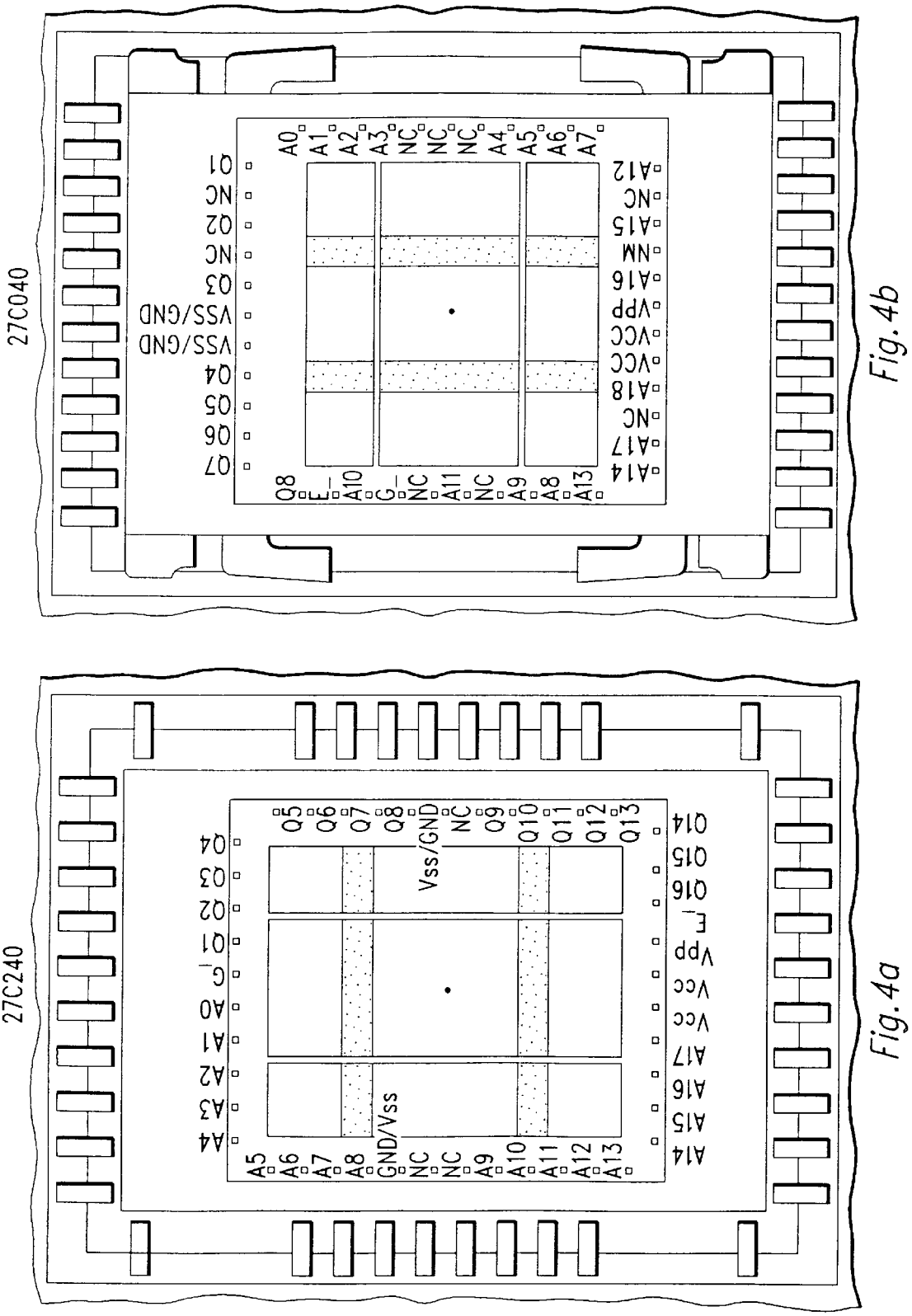
FIGS. 4a and 4b show a plan view, greatly enhanced, of the devices of FIGS. 3a and 3b, taken along the lines 1—1, 2—2 of FIG. 3a and 3—3 and 4—4 of FIG. 3b, respectively.

FIGS. 3a and 3b show greatly expanded views of dual in-line packages 10 and 12, side by side. A 4 Mb EPROM chip with identified bond locations 16 is also shown within each dual in-line package, respectively. FIGS. 4a and 4b show greatly expanded view of the 4 Mb EPROM chip within the DIPs of FIGS. 3a and 3b respectively. A chart comparison of the bond pads of 4a and 4b is shown in FIG. 5. Pins Q1–Q3 and Q14–Q16 of the x16 pin-out option and pins G__, A10, E__ and A0–A2 of the x8 pin-out option are dual-function bond pads.

An electrical schematic diagram of an input only function 18 is shown in FIG. 6. The anode and gate of a silicon controlled rectifier (SCR) 20 are coupled to a bond location 16. A resistor 22 is coupled between the anode of SCR 20 and source of a gated diode transistor 24. The gate and diode of transistor 24 are coupled to ground. Other input structures can be used; however, the common properties for all good input structures are low capacitance, small delays, and good electro-static discharge (ESD) immunity.

FIG. 7 shows a common I/O function 26. A resistor 28 is coupled between a bond pad 16 and the source of an N channel driver transistor 30. The drain of driver transistor 30 is coupled to ground. The source of a transistor 32 is also coupled to bond pad 16. A resistor 34 is coupled between the source of a large P-channel or N-channel pullup transistor 32 and the anode of a diode 36. The cathode of the diode is coupled to ground. For the structure, the line to the input circuitry can come directly off of the bond pad. Other I/O structures can be used; however, the common properties of good I/O structures include large drive capability, low capacitance, and good ESD immunity. The problem is that low capacitance and large drive capability are generally mutually exclusive properties and I/O pins are consistently higher capacitance than only input pins.

FIG. 8 shows a dual-function pad 16 and associated circuitry 38 with an option for either an Input/Output 26 or and Input only configuration 18. The connection between bond pad 16 and one of the circuits is made with a metal option or other suitable means. Having a dual function pin that changes its structure with the same levels required to change the pinout has several benefits. The dual function allows input pins to maintain all of the beneficial input properties for one option and all of the good I/O properties for the second option. Another benefit is that no extra area is required if the single function pins are duplicated. This can happen when the I/O pin of the x8 option is copied for the x16 option.

The architecture of the chip may be varied extensively. The architecture used for a particular application of a chip using this invention depends on factors such as performance, cost and packaging goals.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

We claim:

1. A memory device having different pin-outs or chip configurations, comprising:

a memory chip, said chip having bond pads, at least one of said bond pads being a dual-function bond pad;

for said at least one dual-function pad, said chip having first circuitry for an Input/Output function and having second circuitry for an Input only function;

said chip having a connection option for connecting said dual-function pad to either said first circuitry or said second circuitry.

2. A device according to claim 1 wherein said memory device is an erasable and programmable read-only-memory (EPROM).

3. A device according to claim 2 wherein said memory device is a 4 Mb EPROM.

4. A device according to claim 3 wherein said connection option permits x8 and x16 configurations.

5. A device according to claim 1, said device further including first and second metal connection options and said device further including, for said first connection option, said chip oriented in a DIP (dual in-line package) in a first direction with respect to said dual in-line package; and including, for said second connection option, said chip being oriented a second direction with respect to said dual in-line package, said second direction different from said first direction.

6. A memory device having different pin-outs or chip configurations, comprising:

a memory chip, said chip having bond pads;

at least one of said bond pads coupled to associated circuitry with the chip for an Input only function;

at least one of said bond pads coupled to associated circuitry within the chip for an Input/Output only function; and at least one of said bond pads being a dual-function bond pad coupled by connection option within the chip for one of an Input/Output function or an Input only function.

7. A device according to claim 6 wherein said memory device is an erasable and programmable read-only memory (EPROM).

8. A device according to claim 7 wherein said memory device is a 4 Mb EPROM.

9. A device according to claim 8 wherein said connection option permits x8 and x16 configurations.

10. A device according to claim 9 further including first and second said connection options and further including, for said first connection option, said chip oriented in a DIP (dual in-line package) in a first direction with respect to said dual in-line package; and including, for said second connection option, said chip oriented in a second direction different from said first direction.

11. A method of obtaining different pin-outs or chip configurations of a memory chip, comprising the steps of:

forming a memory chip; and forming bond pads on said memory chip, at least one of said bond pads being a dual function bond pad coupled by connection option to associated circuitry within the chip for an Input/Output or an Input only function.

12. A method according to claim 11 further including first and second connection options and further including, for said first connection option, the step of orienting said chip in a DIP (dual in-line package) in a first direction with respect to said dual in-line package; and, for said second connection option, the step of orienting said chip in a DIP (dual in-line package) in a second direction with respect to said dual in-line package, said second direction different from said first direction.

* * * * *